United States Patent
Frank (10) Patent No.: US 11,121,139 B2
(45) Date of Patent: Sep. 14, 2021

(54) HAFNIUM OXIDE AND ZIRCONIUM OXIDE BASED FERROELECTRIC DEVICES WITH TEXTURED IRIDIUM BOTTOM ELECTRODES

(71) Applicant: INTERNATIONAL BUSINESS MACHINES CORPORATION, Armonk, NY (US)

(72) Inventor: Martin M. Frank, Dobbs Ferry, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1 day.

(21) Appl. No.: 15/815,265

(22) Filed: Nov. 16, 2017

(65) Prior Publication Data
US 2019/0148390 A1    May 16, 2019

(51) Int. Cl.
*H01L 27/11507* (2017.01)
*H01L 49/02* (2006.01)
(Continued)

(52) U.S. Cl.
CPC ...... *H01L 27/11507* (2013.01); *H01L 21/022* (2013.01); *H01L 21/0228* (2013.01); *H01L 21/02181* (2013.01); *H01L 21/02189* (2013.01); *H01L 21/02194* (2013.01); *H01L 21/02282* (2013.01); *H01L 21/28568* (2013.01);
(Continued)

(58) Field of Classification Search
CPC ......... H01L 28/65; H01L 28/82; H01L 28/90; H01L 27/11502; H01L 27/11507; H01L 29/516; H01L 29/517; H01L 29/40111; H01L 21/02181; H01L 21/02189; H01L 2924/01072; H01L 2924/0104
See application file for complete search history.

(56) References Cited

U.S. PATENT DOCUMENTS 5,142,437 A * 8/1992 Kammerdiner ........ H01G 4/008
257/E21.009
5,198,269 A * 3/1993 Swartz ................ C03C 17/3417
427/126.2
(Continued)

FOREIGN PATENT DOCUMENTS

| EP | 0853336 | * | 7/1998 | ......... H01L 21/3205 |
| JP | H11-312801 | * | 11/1999 | ............ H01L 29/43 |
| JP | 2013-251355 | | 12/2013 | |

OTHER PUBLICATIONS

Jun Ge PbZrO3-based anti-ferroelectric films for energy storage applications. Electric power. Université de Valenciennes et du Hainaut-Cambresis, 2015. English.*
(Continued)

*Primary Examiner* — Victoria K. Hall
(74) *Attorney, Agent, or Firm* — Tutunjian & Bitetto, P.C.; Randall Bluestone (57) ABSTRACT

A method of forming a ferroelectric/anti-ferroelectric (FE/AFE) dielectric layer is provided. The method includes forming a metal electrode layer on a substrate, wherein the metal electrode layer has an exposed surface with at least 80% {111} crystal face, and forming an FE/AFE dielectric layer on the exposed surface of the metal electrode layer, wherein the FE/AFE dielectric layer is a group 4 transition metal oxide.

16 Claims, 4 Drawing Sheets

(51) Int. Cl.
*H01L 21/285* (2006.01)
*H01L 21/02* (2006.01)
*H01L 29/78* (2006.01)

(52) U.S. Cl.
CPC .............. *H01L 28/55* (2013.01); *H01L 28/60* (2013.01); *H01L 29/78* (2013.01); *H01L 29/785* (2013.01); *H01L 29/7827* (2013.01)

(56) References Cited

U.S. PATENT DOCUMENTS

| | | | | |
|---|---|---|---|---|
| 5,397,446 | A * | 3/1995 | Ishihara | C23C 14/0036 204/192.15 |
| 5,919,515 | A * | 7/1999 | Yano | C23C 14/08 427/126.3 |
| 5,978,207 | A * | 11/1999 | Anderson | C23C 14/088 257/E21.009 |
| 6,054,331 | A * | 4/2000 | Woo | C23C 14/165 438/3 |
| 6,139,971 | A * | 10/2000 | Bruchhaus | H01L 28/55 428/446 |
| 6,239,457 | B1 | 5/2001 | Suenaga et al. | |
| 6,316,797 | B1 * | 11/2001 | Van Buskirk | H01L 21/31691 257/295 |
| 6,340,621 | B1 * | 1/2002 | Anderson | C23C 14/088 438/396 |
| 6,376,090 | B1 * | 4/2002 | Kijima | B32B 15/04 257/E21.009 |
| 6,498,097 | B1 | 12/2002 | Park et al. | |
| 6,709,776 | B2 * | 3/2004 | Noguchi | C30B 23/02 428/702 |
| 6,728,093 | B2 | 4/2004 | Fox | |
| 6,841,192 | B2 * | 1/2005 | Hashimoto | B41J 2/161 427/100 |
| 6,853,535 | B2 | 2/2005 | Fox et al. | |
| 6,893,965 | B2 * | 5/2005 | Sakamoto | C23C 16/4402 117/104 |
| 6,974,985 | B2 * | 12/2005 | Kurasawa | H01L 28/55 257/296 |
| 7,042,037 | B1 * | 5/2006 | Itokawa | G11C 11/22 257/295 |
| 7,042,141 | B2 * | 5/2006 | Funakubo | C30B 25/02 310/357 |
| 7,063,984 | B2 | 6/2006 | Nagashima et al. | |
| 7,148,532 | B2 * | 12/2006 | Nomura | H01L 27/11502 257/295 |
| 7,176,509 | B2 * | 2/2007 | Maruyama | H01L 27/11502 257/295 |
| 7,199,002 | B2 * | 4/2007 | Hornik | H01L 28/56 438/240 |
| 7,215,067 | B2 * | 5/2007 | Ifuku | H01L 41/316 310/357 |
| 7,238,978 | B2 * | 7/2007 | Miyazawa | H01L 21/31691 257/295 |
| 7,368,774 | B2 * | 5/2008 | Hamada | G11C 11/22 257/295 |
| 7,547,933 | B2 * | 6/2009 | Takamatsu | H01L 21/31691 257/295 |
| 7,569,400 | B2 * | 8/2009 | Kijima | C04B 35/493 438/3 |
| 7,589,450 | B2 * | 9/2009 | Takabe | B41J 2/14233 310/311 |
| 7,674,634 | B2 * | 3/2010 | Maruyama | H01L 27/11507 438/3 |
| 7,692,257 | B2 * | 4/2010 | Ishida | H01L 41/29 257/416 |
| 7,718,487 | B2 * | 5/2010 | Kijima | H01L 21/02205 438/240 |
| 7,732,847 | B2 * | 6/2010 | Tanaka | H01L 29/6684 257/295 |
| 7,883,961 | B2 * | 2/2011 | Tamura | H01L 27/11507 438/240 |
| 7,897,414 | B2 * | 3/2011 | Nagai | H01L 27/11507 438/3 |
| 7,927,890 | B2 * | 4/2011 | Wang | C23C 16/56 438/3 |
| 7,939,347 | B2 * | 5/2011 | Wang | H01L 21/02337 438/3 |
| 7,960,228 | B2 | 6/2011 | Wang et al. | |
| 7,964,904 | B2 * | 6/2011 | Wang | H01L 28/65 257/295 |
| 8,678,560 | B2 * | 3/2014 | Yonemura | B41J 2/055 347/68 |
| 8,866,367 | B2 | 10/2014 | Fox et al. | |
| 9,347,128 | B2 | 5/2016 | Kimura et al. | |
| 9,431,242 | B2 * | 8/2016 | Kijima | C23C 18/1216 |
| 9,761,785 | B2 * | 9/2017 | Fox | H01L 41/1876 |
| 9,773,968 | B2 * | 9/2017 | Kijima | H01L 41/1876 |
| 10,056,394 | B1 * | 8/2018 | Ruediger | H01L 21/02189 |
| 2002/0084480 | A1 * | 7/2002 | Basceri | H01L 27/10852 257/306 |
| 2003/0175425 | A1 * | 9/2003 | Tatsumi | H01L 21/02197 427/255.28 |
| 2004/0004236 | A1 * | 1/2004 | Fox | H01L 28/75 257/295 |
| 2005/0230731 | A1 | 10/2005 | Sawasaki et al. | |
| 2007/0037298 | A1 | 2/2007 | Matsuura et al. | |
| 2007/0052065 | A1 * | 3/2007 | Kanaya | H01L 27/11502 257/532 |
| 2013/0003254 | A1 * | 1/2013 | Koutsaroff | H01G 4/085 361/281 |
| 2013/0192878 | A1 | 8/2013 | Kijima et al. | |
| 2013/0250007 | A1 * | 9/2013 | Ishimori | H01L 41/0477 347/70 |
| 2014/0084753 | A1 * | 3/2014 | Shibuya | H02N 2/0085 310/365 |
| 2014/0353641 | A1 * | 12/2014 | Takahashi | H01L 27/3276 257/40 |
| 2015/0263268 | A1 * | 9/2015 | Fox | G11C 11/50 257/421 |
| 2016/0005961 | A1 * | 1/2016 | Ino | H01L 45/06 257/4 |
| 2016/0064655 | A1 * | 3/2016 | Tao | H01L 27/11507 257/4 |
| 2016/0351556 | A1 * | 12/2016 | Nakaiso | B81B 7/0022 |
| 2017/0018346 | A1 * | 1/2017 | Natali | H01L 43/08 |
| 2018/0061839 | A1 * | 3/2018 | Baars | H01L 29/7843 |
| 2018/0331113 | A1 * | 11/2018 | Liao | H01L 28/40 |
| 2020/0186117 | A1 * | 6/2020 | Huyet | H01L 41/1873 |

OTHER PUBLICATIONS

J. Muller et al., Ferroelectricity in yttrium-doped hafnium oxide, published Dec. 7, 2011, J. App. Physics, vol. 110, No. 114113, all pages. (Year: 2011).*

J. Muller et al, Ferroelectric Zr0.5Hf0.5O2 thin films for nonvolatile memory applications, published Sep. 12, 2011, App. Physics Letters, vol. 99, No. 112901, all pages. (Year: 2011).*

T. Mimura et al., Formation of (111) orientation-controlled ferroelectric orthorhombic HfO2 thin films from solid phase via annealing, published Aug. 4, 2016, App. Physics Letters, vol. 109, No. 052903, all pages. (Year: 2016).*

T. Huan et al., Pathways towards ferroelectricity in hafnia, Physical Rev. B, published Aug. 27, 2014, vol. 90, No. 064111, all pages. (Year: 2014).*

X. Sang et al., On the structural origins of ferroelectricity in HfO2 thin films, published Apr. 23, 2015, App. Physics Letters, vol. 106, No. 162905, all pages. (Year: 2015).*

J. Muller et al., Ferroelectricity in Simple Binary ZrO2 and HfO2, published Jul. 19, 2012, Nano Letters, vol. 12, pp. 4318-4323 (Year: 2012).*

J. Müller et al., Ferroelectricity in yttrium-doped hafnium oxide, Dec. 7, 2011, J. App. Physics, vol. 110, No. 114113, all pages. (Year: 2011).*

Müller, Ferroelectricity in Simple Binary ZrO2 and HfO2, Jul. 19, 2012, Nano Letters, vol. 12, pp. 4318-4323. (Year: 2012).*

(56) References Cited

OTHER PUBLICATIONS

P. Halasyamani & K. Poeppelmeier, Noncentrosymmetric Oxides, Chem. Mater. vol. 10, No. 10, pp. 2753-2769 (1998) (Year: 1998).*
J. Müller et al., Ferroelectricity in Simple Binary ZrO2 and HfO2, Jul. 19, 2012, Nano Letters, vol. 12, pp. 4318-4323 (Year: 2012 ).*
T. D. Huan et al., Pathways towards ferroelectricity in hafnia, Aug. 27, 2014, Physical Review B, vol. 90, No. 064111 (Year: 2014 ).*
Machine translation, Noguchi, Japanese Pat Pub. No. JP H11-312801, translation date: May 11, 2021, Espacenet, all pages. (Year: 2021).*
Eshita et al., "Ferroelectric random access memory (FRAM) devices," Woodhead Publishing Series in Electronic and Optical Materials: No. 64. Advances in Non-volitile Memory and Storage Technology. 2014 pp. 434-454.
Fox et al., "Control of Crystallographic Texture and Surface Morphology of Pt/TiO2 Templates for Enhanced PZT Thin Film Texture," IEEE Transactions on Ultrasonics, Ferroelectrics, and Frequency Control,. vol. 62. No. 1. Jan. 2015. pp. 56-61.
Fujii et al., "First Demonstration and Performance Improvement of Ferroelectric HfO2-based Resistive Switch with Low Operation Current and Intrinsic Diode Property," 2016 Symposium on VLSI Technology Digest of Technical Papers. Jun. 14-16, 2016. pp. 148-149.
Huan et al., "Pathways Towards Ferroelectricity in Hafnia," Physical Review B vol. 90, No. 064111. Aug. 27, 2014. pp. 1-5.
Katayama et al., "Growth of (111)-oriented epitaxial and textured ferroelectric Y-doped HfO2 films for downscaled devices," Applied Physics Letters, vol. 109, No. 112901. Sep. 12, 2016. pp. 1-5.
Kukli et al., Atomic Layer Deposition and Characterization of HfO2 Films on Noble Metal Film Substrates, Journal of the Electrochemical Society, vol. 157. No. 7. May 24, 2005. pp. F75-F82.
Lu et al., "Induction of ferroelectricity in nanoscale ZrO2/HfO2 bilayer thin films on Pt/Ti/Sio2/Si substrates," Acta Materialia. vol. 115. Jun. 4, 2016. pp. 68-75.
Materlik et al., The origin of ferroelectricity in Hf1—xZrxO2: A computational investigation and a surface energy model, Journal of Applied Physics. vol. 117. No. 134109. Apr. 7, 2015. pp. 1-16.
Materlik et al., The Origin of Ferroelectricity in HfxZr1—xO2: A Computational Investigation and a Surface Energy Model, Cornell University Library—Condensed Matter—Materials Science. DOI: arXiv:1507.00588. Submitted on Jul. 2, 2015. pp. 1-50.
Park et al., "The effect of crystallographic orientation and strain of thin Hf0.5Zr0.5O2 film on its ferroelectricity," Applied Physics Letters. vol. 104. No. 072901. Feb. 18, 2014. pp. 1-5.
Pesic et al., "Nonvolatile Random Access Memory and Energy Storage Based on Antiferroelectric Like Hysteresis in ZrO2," Advanced Functional Materials. vol. 26. Issue 41. Nov. 2, 2016. pp. 7486-7494.
Potrepka et al., "Pt/TiO2 Growth Templates for Enhanced PZT films and MEMS Devices," 2010 MRS Fall Meeting. MRS Online Proceedings Library Archive. vol. 1299. Jan. 20, 2011. pp. 1-7.
Reyes-Lillo et al., "Antiferroelectricity in thin-film ZrO2 from first principles," Physical Review B. vol. 90. No. 140103(R). Oct. 13, 2014. pp. 1-5.
Schroeder et al., "Impact of different dopants on the switching properties of ferroelectric hafniumoxide," Japanese Journal of Applied Physics. vol. 53. No. 08LE02. Jul. 10, 2014. pp. 1-6.
Xu et al., "General relationship for cation and anion doping effects on ferroelectric HfO2 formation," 2016 IEEE nternational Electron Devices Meeting. Dec. 3-7, 2016. pp. 1-4.
Examination Report dated Aug. 10, 2020 issued by the UK IPO for GB Application No. GB2008843.1, 2 pages.
Examination Report dated Feb. 22, 2021 issued by the UK IPO for GB Application No. GB2008843.1, 3 pages.

* cited by examiner

HAFNIUM OXIDE AND ZIRCONIUM OXIDE BASED FERROELECTRIC DEVICES WITH TEXTURED IRIDIUM BOTTOM ELECTRODES

BACKGROUND

Technical Field

The present invention generally relates to forming ferroelectric/antiferroelectric (FE/AFE) layers on prescribed crystal faces of metal electrodes, and more particularly to forming FE/AFE devices from hafnium and zirconium based FE/AFE layers on platinum or iridium electrodes.

Description of the Related Art

Ferroelectric materials can be used to form capacitors with a tunable capacitance based on the polarization of such materials exhibiting a hysteresis loop. Ferroelectric materials exhibit a spontaneous nonzero polarization, where such polarization hysteresis can provide a memory function.

Materials can have ferroelectric or anti-ferroelectric phases that depend on the material's preparation and processing. However, polycrystalline materials can have randomly oriented material grains that produce poor ferroelectric and anti-ferroelectric characteristics on a more macroscopic scale. Ferroelectric material can consist of an ordered arrangement of electric dipoles (from the ions and electrons in the material), where adjacent dipoles are oriented in the same (parallel) directions. Antiferroelectric material can consist of an ordered arrangement of electric dipoles (from the ions and electrons in the material), where the adjacent dipoles are oriented in alternating opposite (antiparallel) directions.

A transistor and capacitor can form a dynamic random access memory (DRAM) cell (i.e., a "1T-1C" device). DRAM data storage is based on the presence or the lack of an electrical charge on the capacitor. The electrical charge on a capacitor in a DRAM cell periodically needs to be refreshed to maintain the data storage. A tunable capacitor including a ferroelectric capacitive material sandwiched between two electrodes can replace the typical capacitor having a linear dielectric in the DRAM cell to form a ferroelectric RAM (FeRAM) "1T-1C" device, including the capacitor and resistor. A 1T-1C FeRAM can be suitable for large memory density do to its small area.

FeRAM functions as non-volatile memory by storing information as a polarization state of the ferroelectric (FE) material. Reading a FeRAM memory cell can involve changing the polarization of the ferroelectric material of the capacitor to generate an electric pulse that can be detected and amplified. The FeRAM can maintain a data storage state (i.e., "1" or "0") longer than a typical DRAM cell, where refreshing the FeRAM cell is only required when actually reading or writing the cell.

While FeRAM with reasonable reliability and performance has been marketed, FeRAM having much higher density/scalability and reliability is needed to reduce costs and increase commercial utility and speed.

SUMMARY

In accordance with an embodiment of the present invention, a method of forming a ferroelectric/anti-ferroelectric (FE/AFE) dielectric layer is provided. The method includes forming a metal electrode layer on a substrate, wherein the metal electrode layer has an exposed surface with at least 80% {111} crystal face, and forming an FE/AFE dielectric layer on the exposed surface of the metal electrode layer, wherein the FE/AFE dielectric layer is a group 4 transition metal oxide.

In accordance with another embodiment of the present invention, a method of forming a variable capacitor having a ferroelectric/anti-ferroelectric dielectric layer is provided. The method includes forming a platinum or iridium metal electrode layer on a substrate, wherein the metal electrode layer has an exposed surface with greater than 80% {111} crystal face. The method further includes forming an FE/AFE dielectric layer on the exposed surface of the metal electrode layer, wherein the FE/AFE dielectric layer is a group 4 transition metal oxide. The method further includes forming a second metal electrode layer on the FE/AFE dielectric layer, and patterning the metal electrode layer, FE/AFE dielectric layer, and second metal electrode layer to form the Xvariable capacitor with a width in the range of about 20 nm to about 100 nm.

In accordance with yet another embodiment of the present invention, a ferroelectric/anti-ferroelectric device is provided. The ferroelectric/anti-ferroelectric device includes a platinum or iridium metal electrode layer on a substrate, wherein the metal electrode layer has a surface with greater than 80% {111} crystal face. The device further includes an FE/AFE dielectric layer on the exposed surface of the metal electrode layer, wherein the FE/AFE dielectric layer is a group 4 transition metal oxide. The device further includes a second metal electrode layer on the FE/AFE dielectric layer. The device further includes a first electrical lead to the metal electrode layer and a second electrical lead to the second metal electrode layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate generally to controlling the extent of ferroelectric or anti-ferroelectric phases produced in a deposited material by varying the crystallinity and crystal orientation of an underlying metal electrode. The internal electric dipoles of a ferroelectric material are coupled to the material lattice, so changes in the lattice will change the arrangement of the dipoles.

Embodiments of the present invention relate generally to forming a highly textured (i.e., having a high percentage of grains oriented in a predetermined direction) metal electrode, where the electrode can be highly oriented iridium (Ir) or platinum (Pt), and a high-K metal oxide capacitive layer on the electrode having ferroelectric and/or anti-ferroelectric properties. The electrode can be <111>-oriented iridium (Ir) metal or <111>-oriented platinum (Pt) metal, and the high-K metal oxide capacitive layer can be hafnium oxide (HfO) or zirconium oxide (ZrO) having ferroelectric and/or anti-ferroelectric properties. The orientation of the metal electrode crystals can influence the crystal orientation of the high-K metal oxide capacitive layer, where ferroelectricity, for example, in doped $HfO_2$ is accompanied by a structural phase transition. The devices formed with a high-K metal oxide capacitive layer can have reversible, bi-stable polarization states due to the high-K metal oxide material's polarization hysteresis.

Embodiments of the present invention also relate generally to avoiding toxicological and environmental issues raised by the use of lead (Pb) in the formation of lead-zirconate-titanate ($Pb(Zr,Ti)O_3$, (PZT)) FE/AFE devices.

Embodiments of the present invention relate generally to forming micro-capacitors (e.g., metal-insulator-metal (MIM)) on a substrate from a transition metal with a cubic close packed (CCP) structure and a high-K transition metal oxide with a non-centrosymmetric crystal phase (e.g., Ir/FE-$HfO_2$/Ir, or Pt or Ir/AFE-$ZrO_2$/Pt or Ir).

Embodiments of the present invention relate generally to forming non-volatile ferroelectric memory (e.g., FeRAM), including platinum (Pt) or iridium (Ir) layers and FE/AFE hafnium oxide (HfO), zirconium oxide (ZrO), or hafnium-zirconium oxide ($Hf_xZr_{1-x}O_2$). The ferroelectric film can undergo polarization in response to a voltage applied across upper and lower electrodes, which can remain after the voltage is removed (i.e., have a nonzero remnant polarization Pr). In some embodiments, an electric field can induce ferroelectricity in the FE/AFE dielectric layer through a crystal phase change, where the FE/AFE dielectric layer can have a non-polarized state, where the material crystal phase is centrosymmetric, and an induced polar state, where the material crystal phase is non-centrosymmetric. The change from non-polar to polar can be an external electric field induced phase change, or a work-function induced phase change.

A poor (i.e., random) distribution of grain (crystal) orientations (inferior fiber texture) can produce a broad distribution of switching voltages at which the electric polarization of the material changes. The surface orientation of the crystalline grains can also be referred to as "fiber texture." Whereas, a good (i.e., aligned) distribution of grain orientations can produce a narrow distribution of switching voltages at which the electric polarization of the material changes. Switching can occur when the electric field parallel to the grain axis equals a minimum coercive electric field, $Ec_{min}$.

Exemplary applications/uses to which the present invention can be applied include, but are not limited to: non-volatile memory devices (e.g., FLASH Memory, on-chip non-volatile memory, RFID chips), neuromorphic processing devices (e.g., analog processors), low-power logic devices, variable capacitors, and energy storage capacitors.

It is to be understood that aspects of the present invention will be described in terms of a given illustrative architecture; however, other architectures, structures, substrate materials and process features and steps can be varied within the scope of aspects of the present invention.

Figure 1:
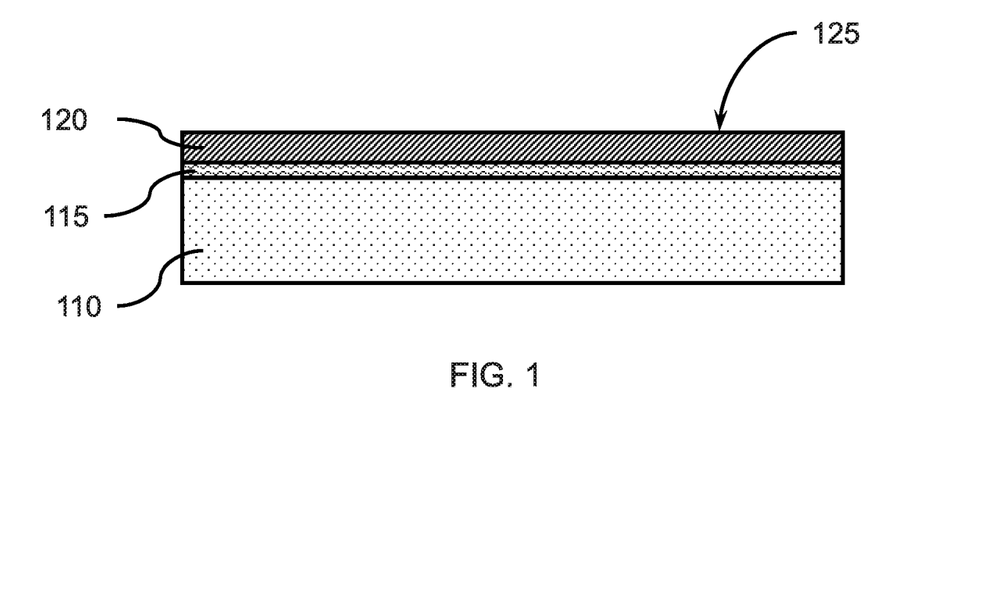
FIG. 1 is a cross-sectional side view showing a metal electrode layer on a substrate, in accordance with an embodiment of the present invention.

Referring now to the drawings in which like numerals represent the same or similar elements and initially to FIG. 1, a metal electrode layer is shown on a substrate, in accordance with an embodiment of the present invention.

In one or more embodiments, a substrate 110 can be a semiconductor material, wafer or a semiconductor-on-insulator (SeOI) stacked wafer. The substrate 110 can include a support layer that provides structural support, and an active semiconductor layer that can form devices. An insulating layer may be between the active semiconductor layer and the support layer to form a semiconductor-on-insulator substrate (SeOI) (e.g., a silicon-on-insulator substrate (SOI)).

The substrate 110 can be a crystalline semiconductor, for example, a IV or IV-IV semiconductor (e.g., silicon (Si), silicon carbide (SiC), silicon-germanium (SiGe), germanium (Ge)), a III-V semiconductor (e.g., gallium-arsenide (GaAs), indium-phosphide (InP), indium-antimonide (InSb)), a II-VI semiconductor (e.g., cadmium-telluride (CdTe), zinc-telluride (ZnTe), zinc sulfide (ZnS), zinc selenide (ZnSe)), or a IV-VI semiconductor (e.g., tin sulfide (SnS), lead selenide (PbSb)). In various embodiments, the substrate 110 can be a single crystal silicon wafer.

The substrate 110 can also be a ceramic material, for example, sapphire, aluminum oxide ($Al_2O_3$), aluminum titanate ($AlTiO_5$), aluminum nitride (AlN), and silicon carbide (SiC), or a metal wettable by iridium (Ir) or platinum (Pt).

In one or more embodiments, a metal electrode layer 120 can be formed on a substrate, where the metal electrode layer 120 can be a transition metal with a cubic close packed (CCP) structure (i.e., face-centered cubic crystal structure).

The metal electrode layer 120 can be a layer of iridium (Ir), a layer of platinum (Pt), or a combination thereof. The metal electrode layer 120 can be formed by physical vapor deposition (PVD) process, for example, sputtering or evaporation. The deposited metal electrode layer 120 can be single crystal or poly-crystalline.

In various embodiments, poly-crystalline layers can have grain sizes in the range of about 5 nm to about 100 μm, or about 10 nm to about 1 μm, or about 10 nm to about 100 nm, or about 6 nm to about 15 nm across, or about 10 nm to 12 nm across, although other grain sizes are contemplated. The majority of the grains of the deposited metal electrode layer 120 can have a <111> orientation normal to the substrate surface that produces a preponderance of {111} crystal faces at the exposed surface of the metal electrode layer. In various embodiments, the number of grains can be minimized, such that the number of grain boundaries are minimized by increasing the grain size. A single crystal metal electrode layer 120 can have an exposed {111} crystal face formed by one crystal grain.

In various embodiments, the platinum or iridium metal electrode layer 120 can be formed at a temperature in the range of about 250° C. to about 600° C., or in a range of about 300° C. to about 500° C. The iridium (Ir) or platinum (Pt) can be metallic iridium (Ir) or platinum (Pt).

In various embodiments, the exposed top surface 125 of the metal electrode layer 120 can be predominantly a {111} crystal plane for formation of a subsequently formed ferroelectric/anti-ferroelectric (FE/AFE) dielectric layer.

In one or more embodiments, the iridium (Ir) or platinum (Pt) grains of a polycrystalline metal electrode layer 120 can be arranged to have ≥80%, but ≤100%, of the crystal grains having their {111} crystal plane forming the top surface of the metal electrode layer 120 (i.e., the metal electrode layer 120 is highly textured). In various embodiments, a majority ≥90%, but ≤100%, of the iridium (Ir) or platinum (Pt) grains of a polycrystalline metal electrode layer 120 can be arranged to have their {111} crystal plane forming the top surface of the metal electrode layer 120. In various embodiments, the metal electrode layer 120 can be a single crystal with 100% of the top surface having a {111} crystal plane.

In one or more embodiments, the exposed top surface 125 of the metal electrode layer 120 can have ≥80% up to 100%, or ≥90% up to 100% of the top surface having a {111} crystal plane. In various embodiments, the exposed top surface 125 of the metal electrode layer 120 can be greater than 90% {111} crystal plane, or greater than 95% {111} crystal plane, or greater than 98% {111} crystal plane.

In one or more embodiments, the metal electrode layer 120 can have a thickness in the range of about 10 nm to about 1 μm, or in the range of about 10 nm to about 100 nm, or about 20 nm to about 50 nm, or about 50 nm to about 90 nm, although other thicknesses are contemplated.

In one or more embodiments, a titanium dioxide ($TiO_2$) layer 115 can be formed on the substrate, and the metal electrode layer 120 can be formed on the titanium dioxide ($TiO_2$) layer 115.

In various embodiments, the metal electrode layer 120 can be polished (e.g., by chemical-mechanical polishing (CMP)) to be flat and smooth, where the surface can have a roughness of <2 nm RMS.

In one or more embodiments, the metal electrode layer 120 is not titanium nitride (TiN). In various embodiments, the metal electrode layer 120 does not include dopant elements, for example, aluminum (Al).

In one or more embodiments, the metal electrode layer 120 can be heat treated after deposition, where the heat treatment can be in the range of about 25° C. to about 700° C., or about 100° C. to about 700° C., or about 200° C. to about 500° C., or about 400° C. to about 700° C., or about 25° C. to about 400° C.

Figure 2:
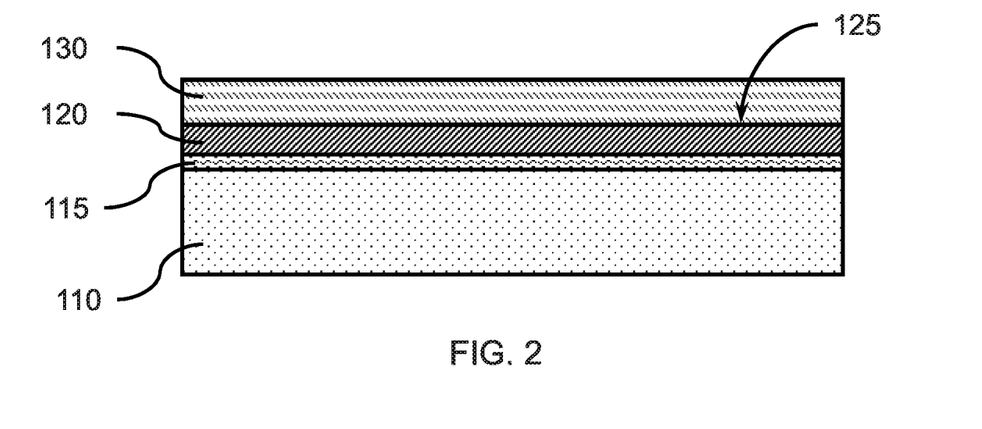
FIG. 2 is a cross-sectional side view showing a ferroelectric/anti-ferroelectric (FE/AFE) layer on the metal electrode layer, in accordance with an embodiment of the present invention.

FIG. 2 is a cross-sectional side view showing a ferroelectric/anti-ferroelectric layer on the metal electrode layer, in accordance with an embodiment of the present invention.

In one or more embodiments, a ferroelectric/anti-ferroelectric (FE/AFE) dielectric layer 130 can be formed on the top surface 125 of the metal electrode layer 120. The FE/AFE dielectric layer can form with a (111) orientation on the metal electrode layer 120, where the crystal orientation of the FE/AFE dielectric layer 130 can be influenced by the underlying highly textured {111} crystal plane forming the top surface of the metal electrode layer 120 to have a non-centrosymmetric (e.g., orthorhombic) crystal structure.

In various embodiments, the FE/AFE layer 130 can be a high-K transition metal oxide selected from the group 4 transition metals (i.e., titanium (Ti), zirconium (Zr), and Hafnium (Hf)) that can form oxides, for example, hafnium oxide (HfO), zirconium oxide (ZrO), or hafnium-zirconium oxide ($Hf_xZr_{1-x}O_2$) where x is about 0.01 to about 0.99, or about 0.1 to about 0.7, or about 0.1 to about 0.5 (e.g., hafnium zirconate ($HfZrO_4$)). The FE/AFE layer 130 can be a binary high-K transition metal oxide selected from the group 4 transition metals (e.g., HfO, ZrO). The FE/AFE dielectric layer 130 can be a multilayer of hafnium oxide (HfO) and zirconium oxide (ZrO), where the layers of HfO and ZrO may alternate. The FE/AFE dielectric layer 130 can have a polar, non-centrosymmetric phase structure.

In various embodiments, the FE/AFE dielectric layer 130 can be formed by chemical solution deposition, PVD (e.g., sputtering), atomic layer deposition (ALD), plasma enhanced atomic layer deposition (PEALD), chemical vapor deposition (CVD), plasma enhanced chemical vapor deposition (PECVD), metal-organic chemical vapor deposition (MOCVD), plasma enhanced metal-organic chemical vapor deposition (PEMOCVD), and combinations thereof. The crystal structure of the FE/AFE dielectric layer 130 can be influenced by the orientation of the metal grains of the metal electrode layer 120. A {111} crystal plane of the metal electrode layer 120 can cause formation of <111> oriented crystals for the FE/AFE dielectric layer 130. Polycrystalline properties of $HfO_2$ or $ZrO_2$ can allow the FE/AFE dielectric layer 130 to have multiple crystals aligned with the underlying crystal structure of the metal electrode layer 120.

In one or more embodiments, the FE/AFE dielectric layer 130 can have a thickness in the range of about 2 nm (nanometers) to about 2 μm (micrometers), or in the range of about 100 nm to about 1 μm, or in the range of about 2 nm to about 10 nm, or in the range of about 5 nm to about 20 nm, or in the range of about 10 nm to about 50 nm, although other thicknesses are contemplated. A FE/AFE dielectric layer formation thicker than 100 nm can be formed by chemical solution deposition. A FE/AFE dielectric layer formation thinner than 100 nm can be formed by ALD or CVD.

In various embodiments, the hafnium oxide (HfO) or zirconium oxide (ZrO) FE/AFE dielectric layer 130 can be stoichiometric (e.g., hafnium dioxide ($HfO_2$) or zirconium dioxide ($ZrO_2$)). In various embodiments, the FE/AFE dielectric layer 130 can be a refractory metal dioxide (e.g., hafnium dioxide ($HfO_2$) or zirconium dioxide ($ZrO_2$)). In various embodiments, the hafnium oxide (HfO) or zirconium oxide (ZrO) FE/AFE layer 130 can be non-stoichiometric.

In various embodiments, the FE/AFE dielectric layer 130 can include a combination of hafnium and zirconium (e.g., $Hf_xZr_{1-x}O_2$), where the concentration of Zr can be in the range of about 1% (x=0.01) to about 99% (x=0.99), or in the range of about 10% (x=0.1) to about 90% (x=0.9), or in the range of about 30% (x=0.3) to about 80% (x=0.8), or in the range of about 30% (x=0.3) to about 50% (x=0.5), or in the range of about 10% to about 50%, although other concentrations are contemplated.

In various embodiments, the HfO crystals of the FE/AFE dielectric layer 130 are not nonpolar. In various embodiments, the HfO crystals of the FE/AFE dielectric layer 130 do not have a monoclinic, tetragonal, or cubic structure.

In one or more embodiments, the FE/AFE dielectric layer is zirconium oxide (ZrO) having a polar, non-centrosymmetric phase structure. The zirconium oxide (ZrO) can have an electric-field-induced transition from a nonpolar to a strongly polar phase, where the non-polar ZrO phase can be tetragonal (P42/nmc), and the polar phase can be orthorhombic ($Pca2_1$). The ZrO FE/AFE dielectric layer 130 can undergo a phase transition at an electric field strength of about 2 MV/cm. The ZrO FE/AFE dielectric layer 130 can be unipolar, rather than bipolar, where one of the crystal phases is non-polar.

The formation of the FE/AFE dielectric layer 130 on the highly textured metal electrode layer 120 can improve the performance of FE/AFE devices, where the reduced number of randomly oriented polarization domains (e.g., crystal grains) narrows the range of switching voltages of a device, and increases the number of devices or percentage of area of a device having oriented polarization domains. The ratio of the standard deviation in switching voltage to the mean switching voltage (σV/Vmean) can be less than 0.2 (<0.2), or less than 0.1 (<0.1). The graph of σV/Vmean can have a full width at half maximum (FWHM) of less than 100 mV for the switching voltage, Vs.

In one or more embodiments, the FE/AFE dielectric layer 130 is stoichiometric hafnium oxide (HfO$_2$) having a polar, non-centrosymmetric phase structure, for example, an orthorhombic-III (ortho-III) phase structure (Pca2$_1$) for HfO$_2$.

In one or more embodiments, the FE/AFE dielectric layer 130 can include dopant elements, for example, aluminum (Al), silicon (Si), germanium (Ge), yttrium (Y), scandium (Sc), gadolinium (Gd), strontium (Sr), lanthanum (La), niobium (Nb), barium (Ba), cerium (Ce), neodynium (Nd), samarium (Sm), erbium (Er), ytterbium (Yb), or a combination thereof. In one or more embodiments, the FE/AFE dielectric layer 130 can include carbon (C), nitrogen (N), or a combination thereof as a dopant. The dopants can be cationic dopants or anionic dopants.

In various embodiments, the FE/AFE dielectric layer 130 can include dopants in a range of about 0.2 at. % (atomic percent) to about 2 at. %, or in a range of about 2 at. % to about 10 at. %, or in a range of about 10 at. % to about 20 at. %, or in a range of about 3 at. % to about 7 at. %, or in a range of about 5 at. % to about 15 at. %. For cationic dopants (e.g., metals), the dopant concentration in at. % can be dopant/([Hf or Zr]+dopant). For anionic dopants (e.g., carbon or nitrogen), the dopant concentration in at. % can be dopant/(oxygen+dopant). The dopants can change the polarization values of the high-K metal oxide FE/AFE dielectric layer 130. Antiferroelectric properties may be initiated at higher dopant concentrations than ferroelectric properties.

In one or more embodiments, the FE/AFE dielectric layer does not include dopant elements, for example, aluminum (Al), silicon (Si), gadolinium (Gd), magnesium (Mg), or yttrium (Y).

In one or more embodiments, the FE/AFE dielectric layer 130 is not a perovskite material, for example, the FE/AFE dielectric layer is neither lead-zirconate-titanate (Pb(Zr,Ti)O$_3$, (PZT)) nor strontium-bismuth-tantalum-oxide (SrBi$_2$Ta$_2$O$_9$). In one or more embodiments, the FE/AFE dielectric layer 130 is not Bi$_4$Ti$_3$O$_{12}$ (BIT), SrBi$_2$Ta$_2$O$_9$ (SBT), SrBi$_2$NbTaO$_9$ (SBTN), or SrBi$_4$Ta$_4$O$_{15}$.

In one or more embodiments, the FE/AFE dielectric layer 130 can be heat treated after formation, where the heat treatment can be in the range of about 280° C. to about 1350° C., or about 400° C. to about 1200° C., or about 500° C. to about 1000° C., or about 600° C. to about 900° C., or about 700° C. to about 800° C., or about 500° C. to about 700° C. In various embodiments, the heat treatment of Hf$_x$Zr$_{1-x}$O$_2$ can be in the range of about 280° C. to about 400° C. for x=about 0.5.

Figure 3:
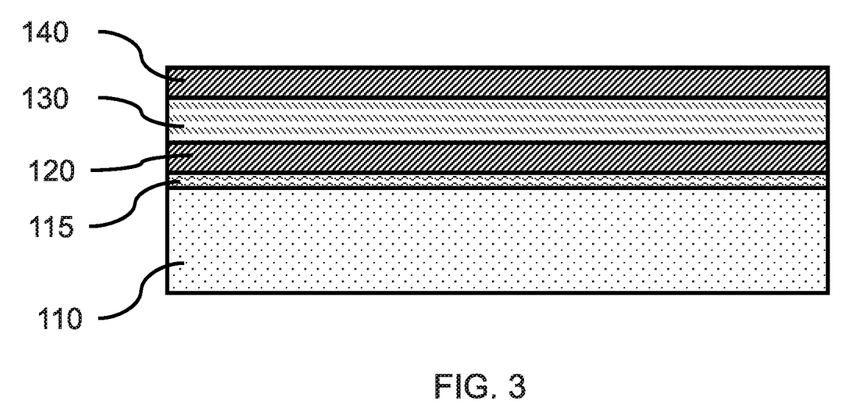
FIG. 3 is a cross-sectional side view showing a second metal electrode layer on the ferroelectric/anti-ferroelectric layer, in accordance with an embodiment of the present invention.

FIG. 3 is a cross-sectional side view showing a second metal electrode layer on the ferroelectric/anti-ferroelectric layer, in accordance with an embodiment of the present invention.

In one or more embodiments, a second metal electrode layer 140 can be formed on the FE/AFE layer, where the second metal electrode layer 140 can be iridium (Ir), platinum (Pt), aluminum (Al), or a conductive metal nitride (e.g., tantalum nitride (TaN), titanium nitride (TiN)). In various embodiments, the second metal electrode layer 140 can be iridium (Ir) or platinum (Pt), but not tantalum nitride or titanium nitride.

In one or more embodiments, a second metal electrode layer 140 can be formed by physical vapor deposition (PVD) process, for example, sputtering or evaporation. The deposited second metal electrode layer 140 can be single crystal or poly-crystalline. The deposited second metal electrode layer 140 can have crystal grain sizes in the same ranges as those of the first metal electrode layer 120.

In various embodiments, the second metal electrode layer 140 can have a <111> orientation normal to the surface, such that a {111} crystal face is in contact with the top surface of the FE/AFE dielectric layer 130. In various embodiments, the second metal electrode layer 140 does not have a <111> orientation normal to the surface.

Figure 4:
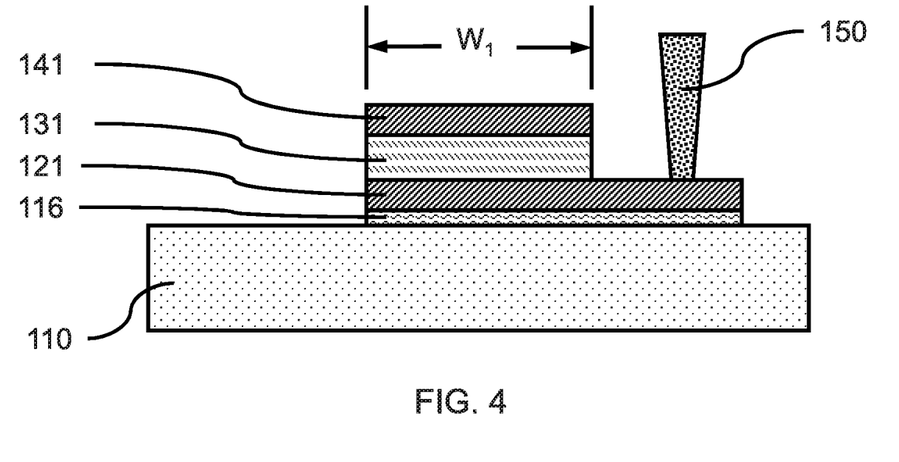
FIG. 4 is a cross-sectional side view showing a patterned stack of a first metal electrode layer, a ferroelectric/anti-ferroelectric layer, and a second metal electrode layer on a substrate, in accordance with an embodiment of the present invention.

FIG. 4 is a cross-sectional side view showing a patterned stack of a first metal electrode layer, a ferroelectric/anti-ferroelectric layer, and a second metal electrode layer on a substrate, in accordance with an embodiment of the present invention.

In one or more embodiments, the titanium dioxide (TiO$_2$) layer 115, first metal electrode layer 120, FE/AFE dielectric layer 130, and second metal electrode layer 140 can be masked and patterned to form an FE/AFE capacitor stack including a titanium dioxide (TiO$_2$) slab 116, first metal electrode slab 121, FE/AFE dielectric slab 131, and second metal electrode slab 141. The patterned FE/AFE capacitor stack can be formed by directional etching (e.g., physically-assisted reactive ion etching (PARIE)), where the patterned FE/AFE capacitor stack can be formed as part of a front end of line (FEOL) process, a back end of line (BEOL) process, or between the FEOL and BEOL processes, where the layers may be formed along with semiconductor layers and insulator layers for other devices, including transistors (e.g., MOSFETs, FinFETs, VT FinFETS, etc.), or during metalization.

In various embodiments, the titanium dioxide (TiO$_2$) slab 116, first metal electrode slab 121, FE/AFE dielectric slab 131, and second metal electrode slab 141 of an FE/AFE capacitor can have a width, W$_1$, in the range of about 10 nm to about 100 µm, or about 10 nm to about 1 µm, or about 20 nm to about 100 nm, or about 30 nm to about 70 nm, or about 30 nm to about 50 nm, where the length perpendicular to the width can be the same dimension as the width or up to twice (i.e., 2×) the width. A device may be square, rectangular, or round. In various embodiments, the grain size of the first metal electrode slab 121, FE/AFE dielectric slab 131, and/or second metal electrode slab 141 can be larger than the dimensions of the capacitor, such that the first metal electrode slab 121, FE/AFE dielectric slab 131, and/or second metal electrode slab 141 are single crystal at the device dimensions. A limitation on the minimum size of the capacitor can be determined by the amount of change necessary to be detected.

In various embodiments, the titanium dioxide (TiO$_2$) slab 116 and first metal electrode slab 121 can extend outward from the side edge of the FE/AFE dielectric slab 131 and second metal electrode slab 141, where the first metal electrode slab 121 can form a bottom electrode of the capacitor connected to a transistor by an electrical lead 150.

In one or more embodiments, the switching voltage of the FE/AFE dielectric slab 131 is proportional to the thickness of the FE/AFE dielectric slab 131.

In one or more embodiments, the electric field that causes a phase transition to a ferroelectric state can be in the range of about 100 V/cm (0.01 V/nm) to about 2 MV/cm (0.2 V/nm) or about 1 MV/cm (0.1 V/nm) to about 2 MV/cm (0.2 V/nm).

In one or more embodiments, a difference in work function between the first metal electrode slab 121 and second metal electrode slab 141 can create an electric field across the FE/AFE dielectric slab 131 to impose a polarized state on the FE/AFE dielectric slab 131.

Figure 5:
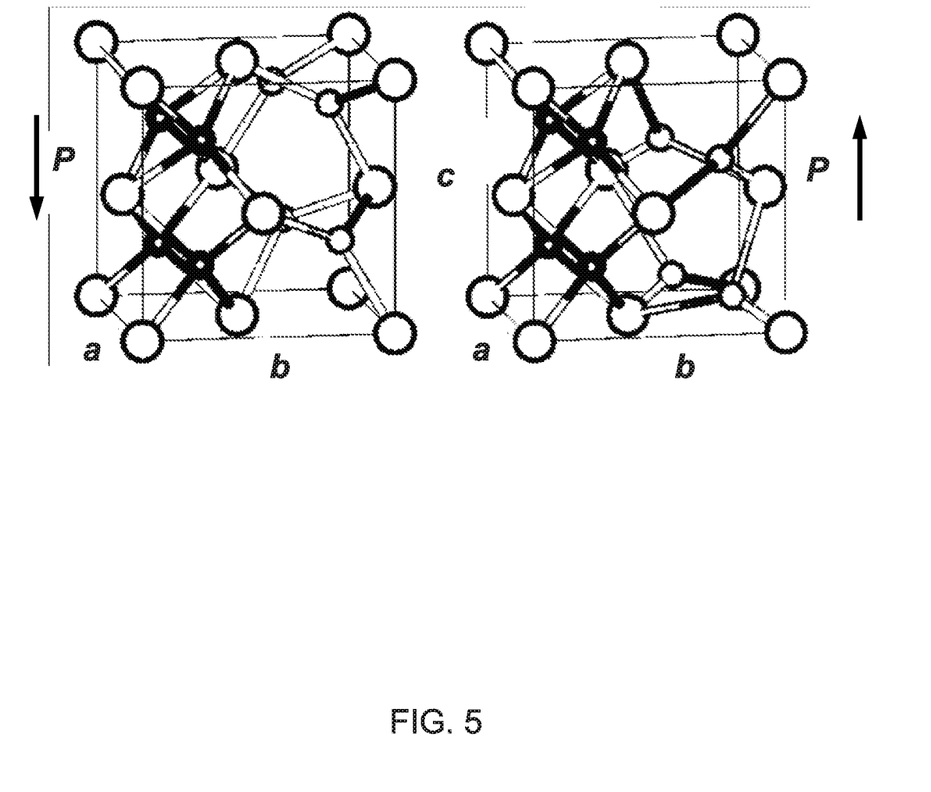
FIG. 5 is an illustration of the orthorhombic-III crystal structure for an $HfO_2$ FE/AFE dielectric layer, in accordance with an embodiment of the present invention.

FIG. 5 is an illustration of the orthorhombic-III crystal structure for an $HfO_2$ FE/AFE dielectric layer, in accordance with an embodiment of the present invention.

The left image of the $HfO_2$ illustrates the atomic arrangement for the orthorhombic-III crystal structure ($Pca2_1$ or $Pmn2_1$ space groups) having a first polarization. The right image of the $HfO_2$ illustrates the atomic arrangement for the orthorhombic-III crystal structure having the opposite polarization. A shift can be seen in the positioning of the oxygen atoms in the crystal lattice, whereas the Hf atoms remain at the corners and face centers of the lattice. The c-axis is the polarization, P, direction.

Spontaneous polarization can be derived from relative displacement of anions and cations in the crystal lattice, such that an electric dipole is spontaneously generated. The ions can occupy one of the two stable positions and can be moved between the positions by applying an external electric field. The shift in the oxygen positions demonstrates the rearrangement of the dipoles responsible for the ferroelectric properties.

Figure 6:
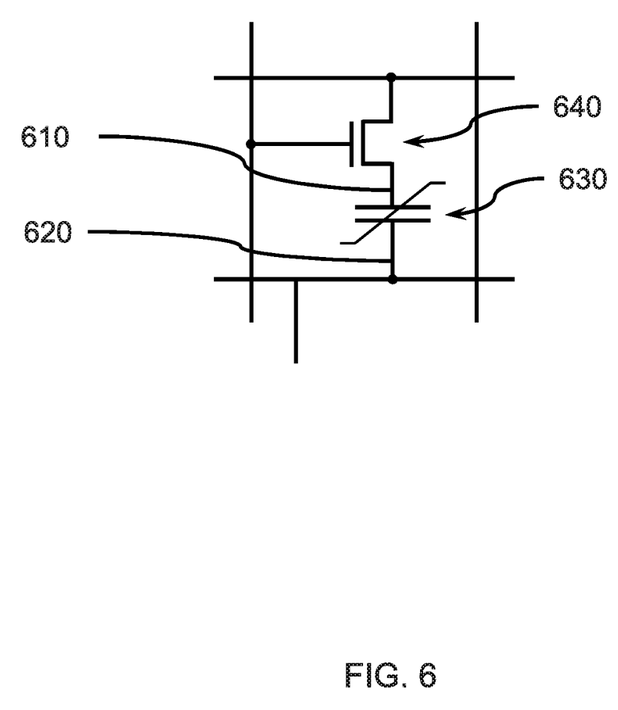
FIG. 6 is a circuit diagram showing an FeRAM cell, in accordance with an embodiment of the present invention.

FIG. 6 is a circuit diagram showing an FeRAM cell, in accordance with an embodiment of the present invention.

In one or more embodiments, a first electrical lead 610 to a first metal electrode layer, and a second electrical lead 620 to a second metal electrode of a FE/AFE capacitor 630 including a FE/AFE dielectric layer, as described herein. A first electrical lead 610 can be electrically connected to a transistor 640, where the transistor 640 can be, for example, a metal-oxide-semiconductor field effect transistor (MOSFET), a fin field effect transistor (FinFET), or a vertical transport field effect transistor (VT FinFET). The transistor 640 and FE/AFE capacitor 630 can be electrically connected to word lines, bit lines, and other lines, as would be known in the art to form a memory cell.

The FeRAM cell can be fabricated as a planar capacitor arrangement, where the FE/AFE capacitor is over an isolation region (e.g., shallow trench isolation (STI) region), or a stacked capacitor arrangement, where the FE/AFE capacitor is over a source/drain of the transistor.

In various embodiments, a charge on the FE/AFE capacitor 630 can be measured/detected through direct tunneling where the FE/AFE dielectric layer may have a thickness in a range of about 2 nm to about 4 nm. The resistance of the FE/AFE dielectric slab 131 of the FE/AFE capacitor 630 can vary, where the resistance can be determined by the area ratio of up—(parallel) versus down—(antiparallel) polarized domains. To write data to a FeRAM memory cell, the area ratio of up-/down-polarized domains in the FE/AFE dielectric slab 131 is changed by applying a (+/−) voltage pulse.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$, where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein s for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presenceor addition of one or rrrore other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation addition to the orientation depicted in the FIGS. For example, if the device in the FIGS. is turned over, elements described as "below" or "beneath" other elements or features would then be oriented "above" the other elements or features. Thus, the term. "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a ferroelectric/anti-ferroelectric (FE/AFE) dielectric layer, comprising:
   forming an iridium (Ir) first metal electrode layer on a substrate, wherein the iridium (Ir) first metal electrode layer has an exposed surface with at least 80% {111} crystal plane; and
   forming a hafnium oxide (HfO) FE/AFE dielectric layer that has an orthorhombic-III polar non-centrosymmetric phase structure directly on the exposed surface of the iridium (Ir) first metal electrode layer.

2. The method of claim 1, wherein the iridium (Ir) first metal electrode layer is formed by physical vapor deposition (PVD).

3. The method of claim 2, wherein the hafnium oxide (HfO) FE/AFE dielectric layer is formed by atomic layer deposition (ALD) or chemical solution deposition.

4. The method of claim 1, wherein the hafnium oxide (HfO) FE/AFE dielectric layer is stoichiometric hafnium oxide ($HfO_2$).

5. The method of claim 1, further comprising forming a second metal electrode layer on the hafnium oxide (HfO) FE/AFE dielectric layer, wherein the hafnium oxide (HfO) FE/AFE dielectric layer has a ratio of a standard deviation in switching voltage to a mean switching voltage ($\sigma V/Vmean$) of greater than 0 and less than 0.2 (<0.2).

6. The method of claim 1, wherein the iridium (Ir) first metal electrode layer is formed at a temperature in the range of about 250° C. to about 600° C.

7. The method of claim 1, wherein the exposed surface of the iridium (Ir) first metal electrode layer has a roughness of less than 2 nm RMS.

8. The method of claim 1, wherein the iridium (Ir) first metal electrode layer is polycrystalline with the exposed surfaces of the grains of the polycrystalline iridium (Ir) first metal electrode layer arranged to have ≥90% but ≤100% of the {111} crystal plane forming the exposed surface of the iridium (Ir) first metal electrode layer.

9. A method of forming a variable capacitor having a ferroelectric/anti-ferroelectric (FE/AFE) dielectric layer, comprising:
   forming a platinum first metal electrode layer on a substrate, wherein the platinum first metal electrode layer has an exposed surface with at least 80% {111} crystal plane;
   forming a zirconium oxide (ZrO) FE/AFE dielectric layer that has a polar non-centrosymmetric phase structure directly on the exposed surface of the platinum first metal electrode layer;
   forming a second metal electrode layer on the zirconium oxide (ZrO) FE/AFE dielectric layer; and
   patterning the platinum first metal electrode layer, the zirconium oxide (ZrO) FE/AFE dielectric layer, and the second metal electrode layer to form the variable capacitor with a width in the range of about 20 nm to about 100 nm.

10. The method of claim 9, wherein the zirconium oxide (ZrO) FE/AFE dielectric layer has an orthorhombic phase structure having <111>oriented crystals aligned with the underlying crystal structure of the platinum first metal electrode that provides a ratio of a standard deviation in switching voltage to a mean switching voltage ($\sigma/Vmean$) of greater than 0 and less than 0.2 (<0.2).

11. A ferroelectric/anti-ferroelectric device, comprising:
   an iridium (Ir) first metal electrode layer on a substrate, wherein the iridium (Ir) first metal electrode layer has a surface with at least 80% {111} crystal plane;
   an FE/AFE dielectric layer that has a polar non-centrosymmetric phase structure directly on the surface of the iridium (Ir) first metal electrode layer, wherein the FE/AFE dielectric layer is zirconium oxide (ZrO) or hafnium oxide (HfO);
   a second platinum or iridium metal electrode layer on the FE/AFE dielectric layer; and
   a first electrical lead to the first iridum (Ir) metal electrode layer and a second electrical lead to the second platinum or irridum metal electrode layer.

12. The ferroelectric/anti-ferroelectric device of claim 11, wherein the FE/AFE dielectric layer is hafnium oxide (HfO) having a polar, orthorhombic-III structure.

13. The ferroelectric/anti-ferroelectric device of claim 11, wherein the FE/AFE dielectric layer is zirconium oxide (ZrO) having the polar, non-centrosymmetric phase structure.

14. The ferroelectric/anti-ferroelectric device of claim 11, wherein the first electrical lead is electrically connected to a transistor to form a ferroelectric dynamic random access memory (FeRAM) cell, and the FE/AFE dielectric layer has a ratio of a standard deviation in switching voltage to a mean switching voltage (σV/Vmean) of greater than 0 and less than 0.2 (<0.2).

15. The ferroelectric/anti-ferroelectric device of claim 14, wherein the transistor is a metal-oxide-semiconductor field effect transistor (MOSFET), a fin field effect transistor (FinFET), or a vertical transport field effect transistor (VT FinFET).

16. The ferroelectric/anti-ferroelectric device of claim 15, wherein the FE/AFE dielectric layer has a width, $W_1$, in the range of about 20 nm to about 100 nm.

* * * * *